US012751039B2

(12) United States Patent
Tzeng et al.

(10) Patent No.: US 12,751,039 B2
(45) Date of Patent: Sep. 29, 2026

(54) CONTACT STRUCTURE WITH ARCHED TOP SURFACE AND FABRICATION METHOD THEREOF

(71) Applicant: Taiwan Semiconductor Manufacturing Company, Ltd., Hsinchu (TW)

(72) Inventors: Ruoh-Ning Tzeng, New Taipei City (TW); Kuo-Hua Pan, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 753 days.

(21) Appl. No.: 18/163,400

(22) Filed: Feb. 2, 2023

(65) Prior Publication Data

US 2024/0266412 A1 Aug. 8, 2024

(51) Int. Cl.

*H10D 30/62* (2025.01)
*H10D 30/01* (2025.01)
*H10D 64/01* (2025.01)
*H10D 84/01* (2026.01)
*H10D 84/03* (2025.01)

(52) U.S. Cl.

CPC ....... *H10D 30/6219* (2025.01); *H10D 30/024* (2025.01); *H10D 30/6211* (2025.01); *H10D 64/021* (2025.01); *H10D 84/013* (2025.01); *H10D 84/0147* (2025.01); *H10D 84/038* (2025.01)

(58) Field of Classification Search

CPC ........... H10D 30/6219; H10D 30/6211; H10D 84/013; H10D 84/0147; H10D 61/021; H10D 30/024; H10D 84/038

See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |

(Continued)

*Primary Examiner* — Christine A Enad

(74) *Attorney, Agent, or Firm* — McClure, Qualey & Rodack, LLP

(57) ABSTRACT

Structures and formation methods of a semiconductor device structure are provided. The semiconductor device structure includes a gate electrode layer formed over a substrate and a gate spacer structure formed over a sidewall of the gate electrode layer. The semiconductor device structure also includes a source/drain contact structure adjacent to the gate spacer structure and separated from the gate electrode layer by the gate spacer structure. The source/drain contact structure includes a conductive base portion formed over a source/drain region in the substrate and a conductive capping portion with an arched top surface formed over the conductive base portion. The top surface of the conductive base portion is lower than the top surface of the gate electrode layer. The semiconductor device structure further includes a first dielectric capping layer formed over the source/drain contact structure.

20 Claims, 13 Drawing Sheets

(56) References Cited

U.S. PATENT DOCUMENTS

| | | | | |
|---|---|---|---|---|
| 9,236,300 | B2 | 1/2016 | Liaw | |
| 9,520,482 | B1 | 12/2016 | Chang et al. | |
| 9,576,814 | B2 | 2/2017 | Wu et al. | |
| 2017/0186849 | A1* | 6/2017 | Chen | H01L 21/76897 |
| 2020/0126843 | A1* | 4/2020 | Tsai | H10D 30/024 |
| 2020/0135912 | A1* | 4/2020 | Tsai | H10D 84/038 |
| 2022/0328485 | A1* | 10/2022 | Bae | H10D 30/6219 |

* cited by examiner

CONTACT STRUCTURE WITH ARCHED TOP SURFACE AND FABRICATION METHOD THEREOF

BACKGROUND

The semiconductor industry has experienced rapid growth and demands for highly integrated semiconductor device structures are increasing. Technological advances in integrated circuit (IC) design and materials have produced generations of ICs. Each generation has smaller and more complex circuits than previous generations. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs, and for these advances to be realized, similar developments in IC processing and manufacturing are needed. For example, three-dimensional design (e.g., fin field effect transistor (FinFET)) has been introduced to replace the planar transistor. Therefore, challenges from both fabrication and design issues have resulted in the development of the three-dimensional transistors.

However, as three-dimensional transistors scaling-down continues, reliable interconnect structures at smaller and smaller sizes are need.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A to 2N show cross-sectional views of various stages of forming a semiconductor device structure, in accordance with some embodiments, in which FIGS. 2A to 2B illustrate the cross-sectional representations of the semiconductor device structure shown along line 2-2' in FIGS. 1A to 1B in accordance with some embodiments.

DETAILED DESCRIPTION

Figure 1A:
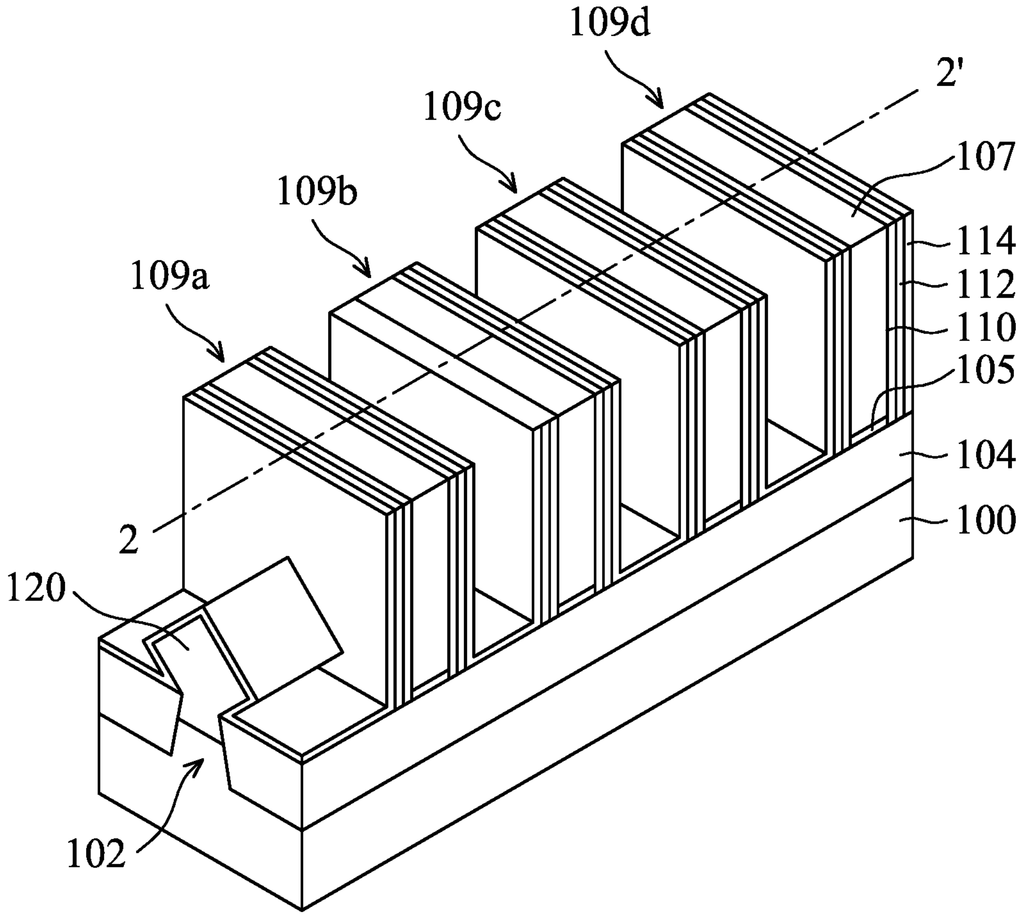
FIGS. 1A to 1B illustrate perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as “beneath,” “below,” “lower,” “above,” “upper” and the like, may be used herein for ease of description to describe one element or feature’s relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

The term “substantially” in the description, such as in “substantially flat” or in “substantially coplanar”, etc., will be understood by the person skilled in the art. In some embodiments the adjective substantially may be removed. Where applicable, the term “substantially” may also include embodiments with “entirely”, “completely”, “all”, etc. Where applicable, the term “substantially” may also relate to 90% or higher, such as 95% or higher, especially 99% or higher, including 100%. Furthermore, terms such as “substantially parallel” or “substantially perpendicular” are to be interpreted as not to exclude insignificant deviation from the specified arrangement and may include for example deviations of up to 10°. The word “substantially” does not exclude “completely” e.g. a composition which is “substantially free” from Y may be completely free from Y.

Terms such as “about” in conjunction with a specific distance or size are to be interpreted so as not to exclude insignificant deviation from the specified distance or size and may include for example deviations of up to 10%. The term “about” in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments are generally related to semiconductor device structures and manufacturing methods, and more particularly to interconnect structures (e.g., source/drain (S/D) contacts and/or vias) and formation methods thereof. Source/drain (S/D) may refer to a source or a drain of a transistor, individually or collectively dependent upon the context. S/D contacts/vias refer to metallic contacts/vias that land on S/D regions. Forming S/D contacts may include various processes. One of the processes is to etch a dielectric layer over the S/D regions through an etch mask so that the S/D regions can be exposed for making connection to the S/D contacts. The etching of the dielectric layer may be anisotropic or isotropic. Sometimes, portions of gate electrodes and/or gate spacer structures may be etched or removed during the etching process. Consequently, etched gate electrodes may be exposed from contact/via holes, and gate electrodes and S/D contacts/vias may be accidentally shorted. Embodiments solve the above and other problems by using a process that includes recessing S/D contacts and capping each recessing S/D contact with a conductive capping layer and an overlying dielectric capping layer. Due to the existence of the conductive capping layer and the dielectric capping layer, the S/D contacts are safely isolated from the gate electrodes, while reducing the contact resistance between the recessed S/D contact and the overlying S/D via.

The disclosed methods and structures can be applied to fin field effect transistors (FinFETs), gate-all-around (GAA) transistors, or other types of transistors. GAA transistors refer to transistors having gate stacks (which include gate electrodes and gate dielectric layers) surrounding transistor channels, such as vertically stacked gate-all-around horizontal nanowire or nanosheet MOSFET devices. Those of ordinary skill in the art should appreciate that they may readily use the present disclosure as a basis for designing or modifying other structures (such as GAA transistors) for carrying out the same purposes and/or achieving the same advantages of the embodiments introduced herein.

Figure 1B:
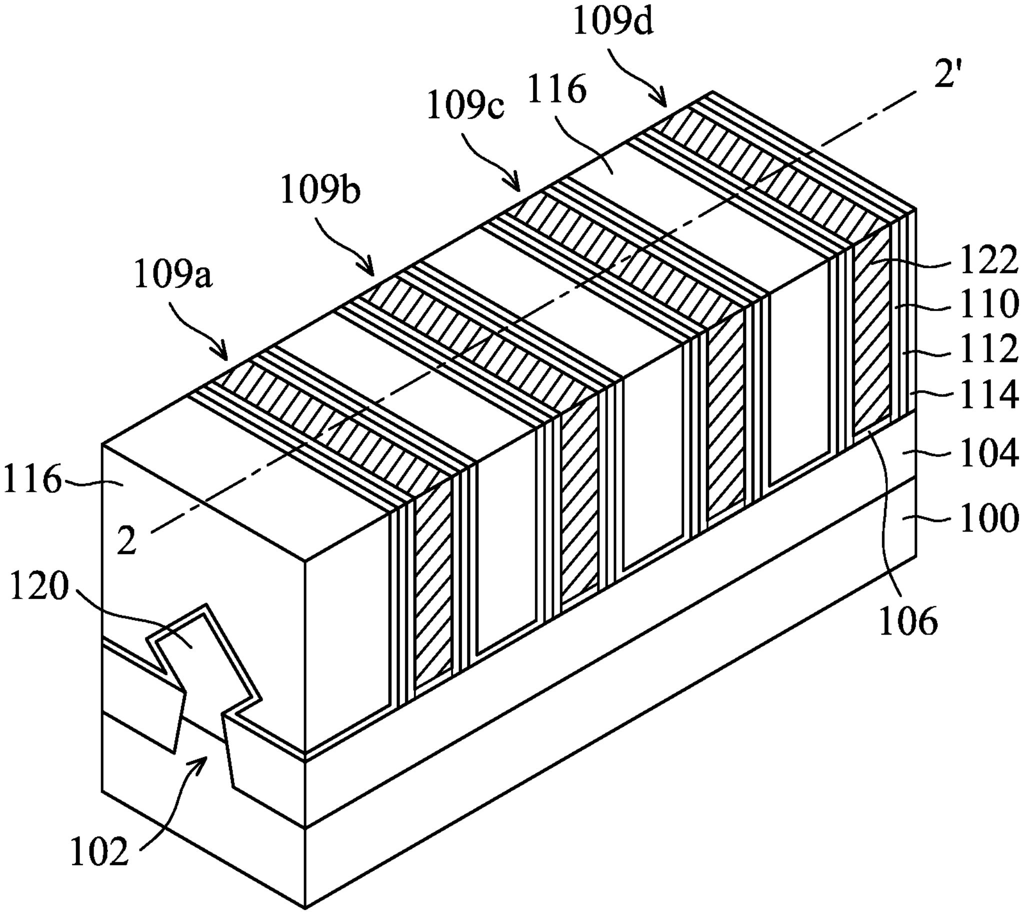
Figure 2A:
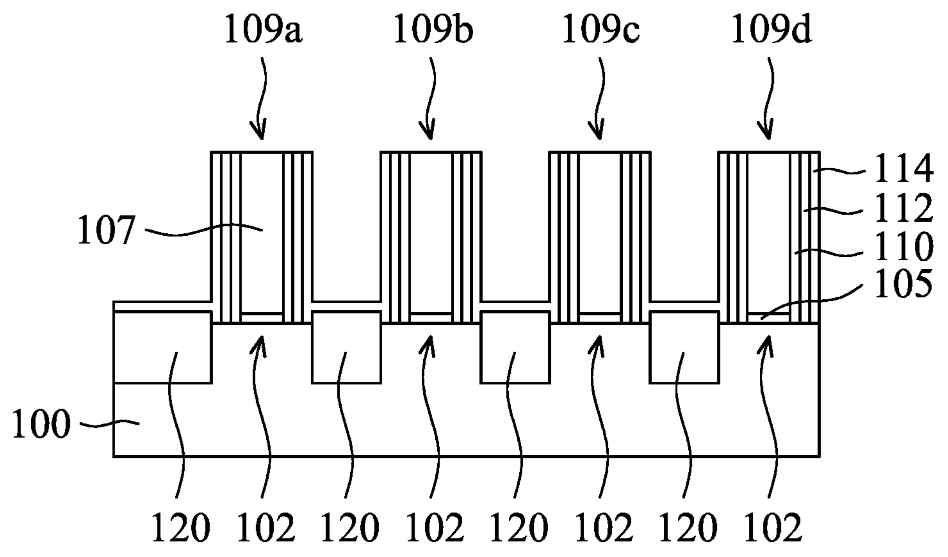
Figure 2B:
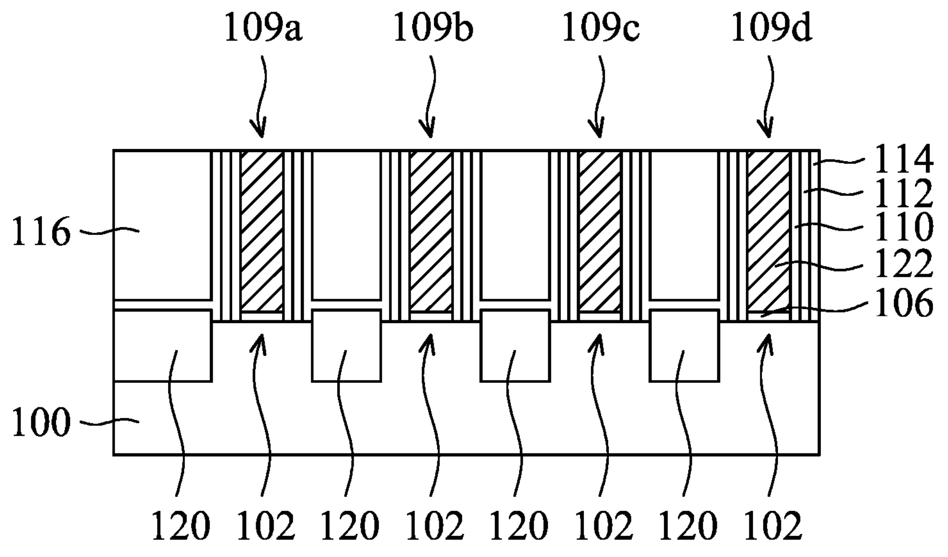
Figure 2C:
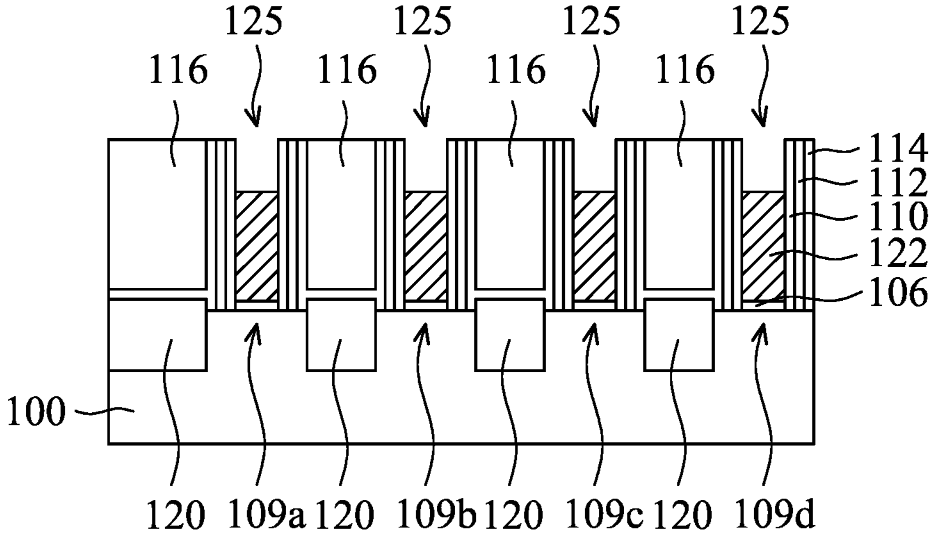
Figure 2D:
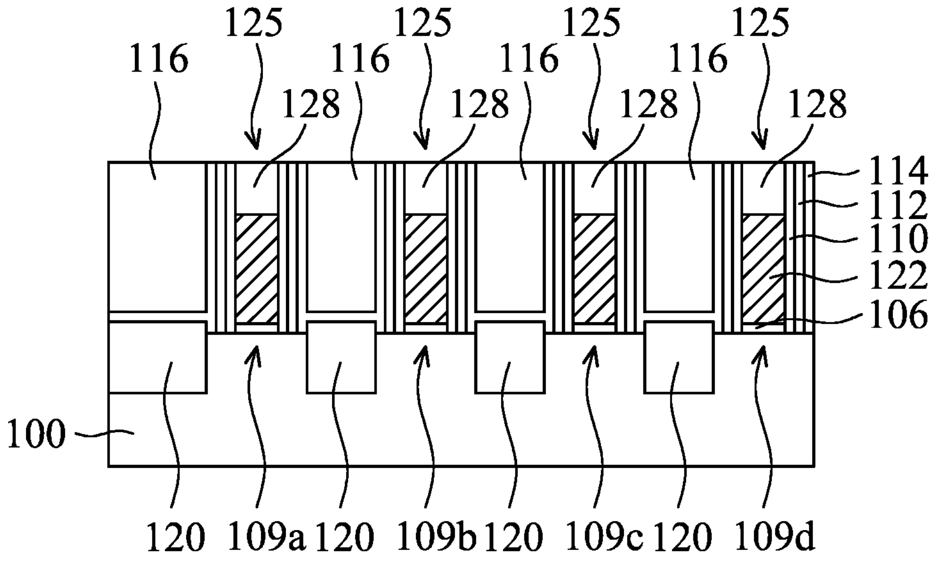
Figure 2E:
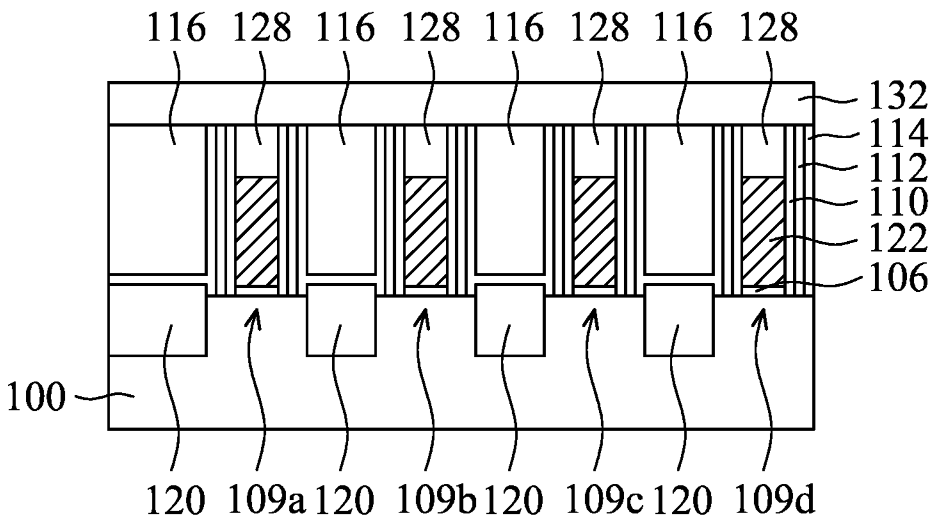
Figure 2F:
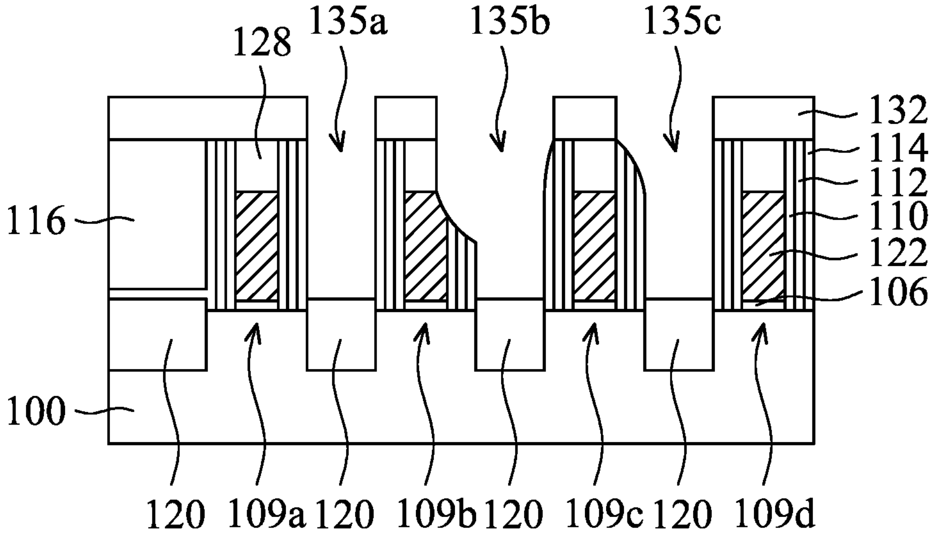
Figure 2G:
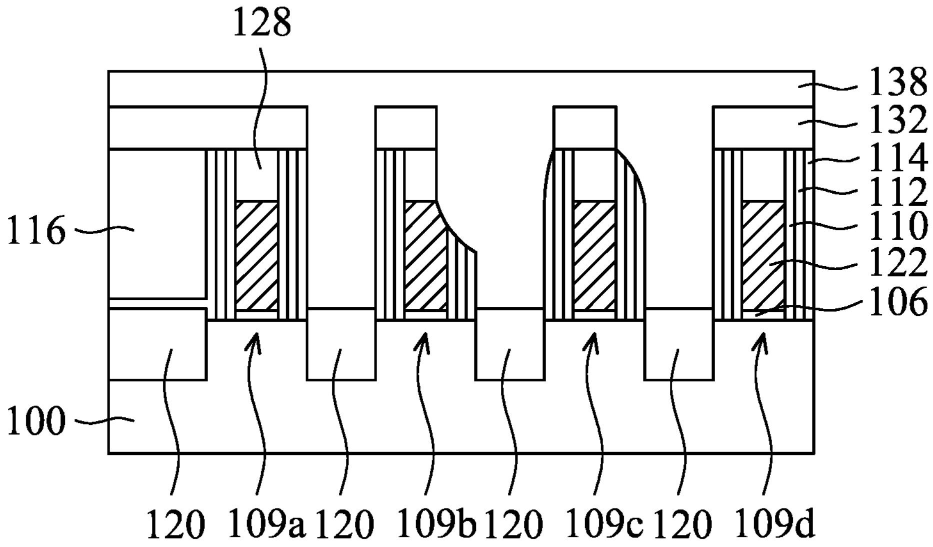
Figure 2H:
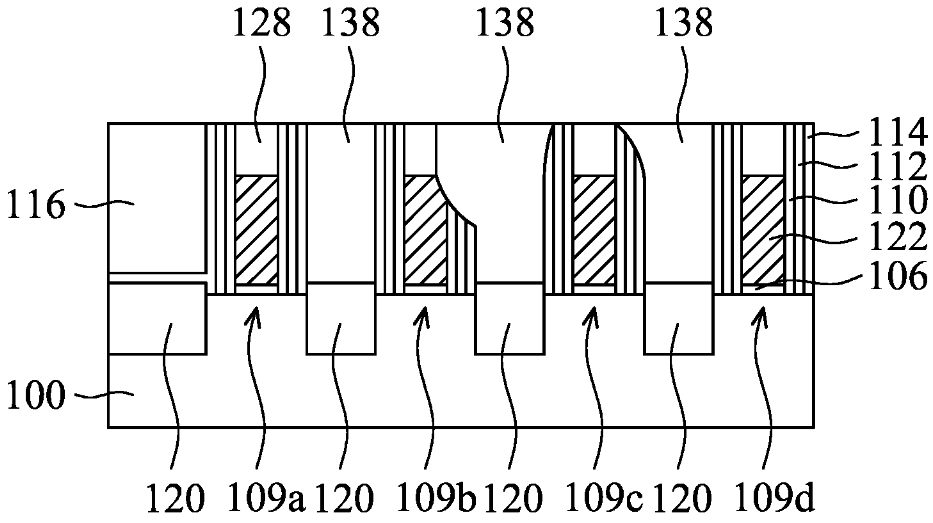
Figure 2I:
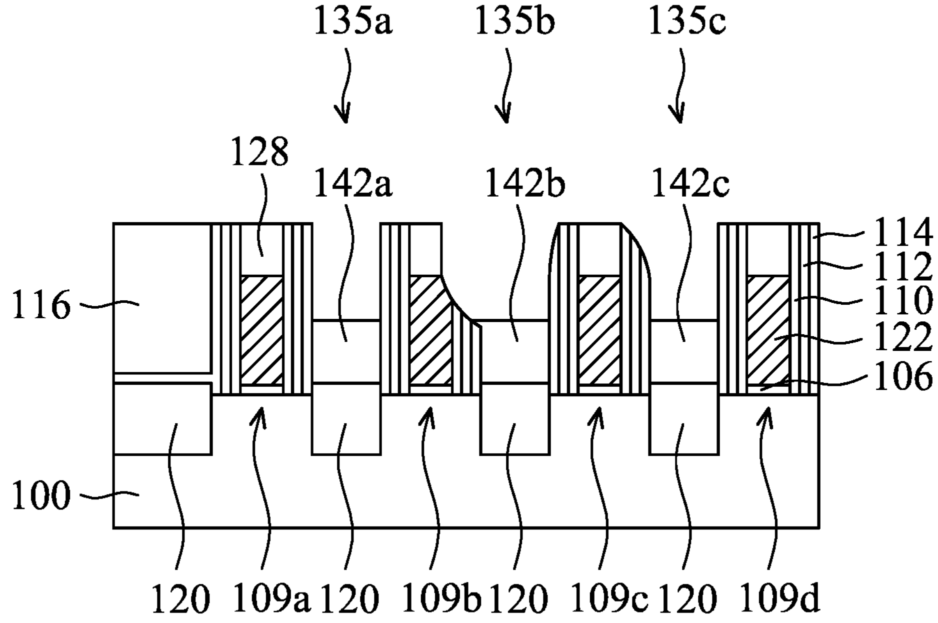
Figure 2J:
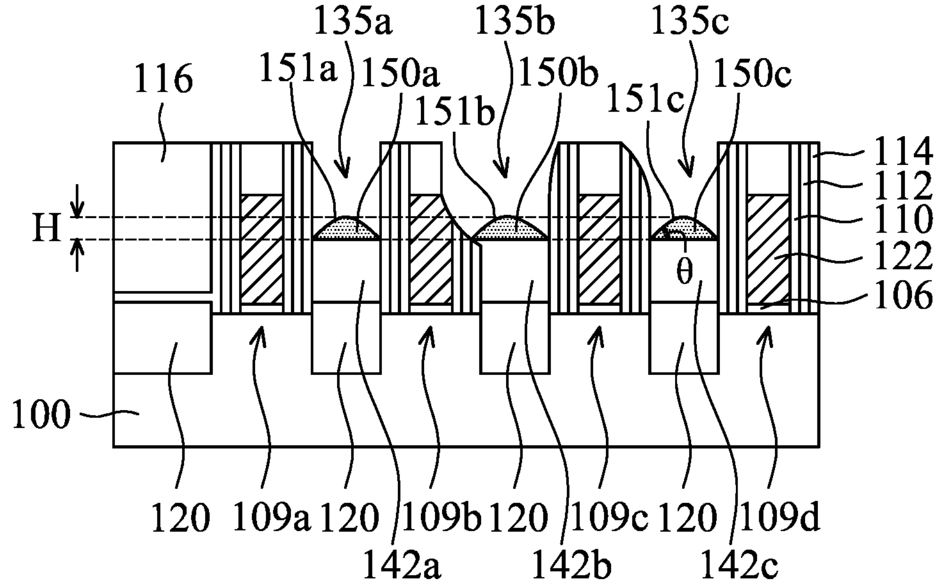
Figure 2K:
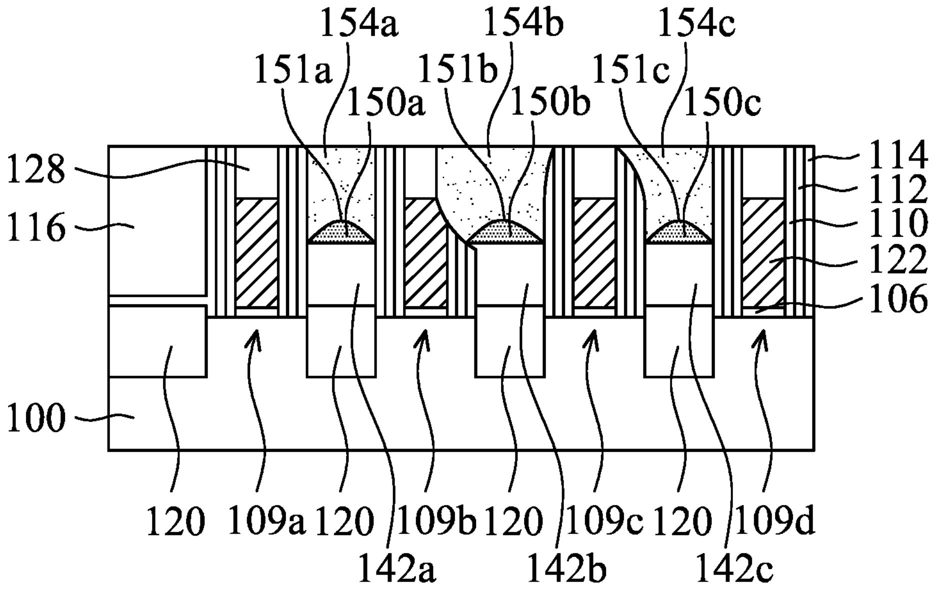
Figure 2L:
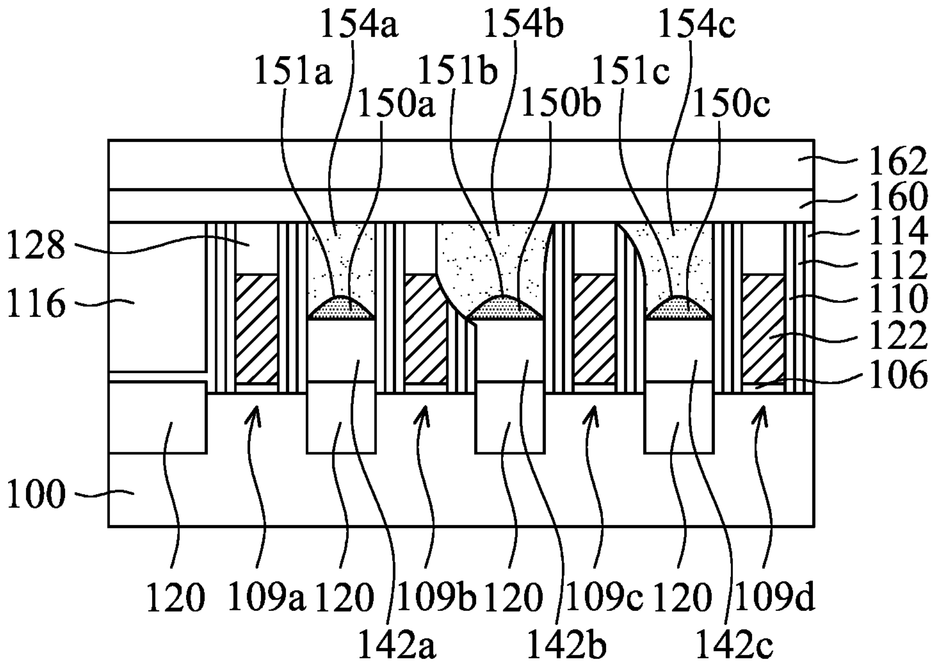
Figure 2M:
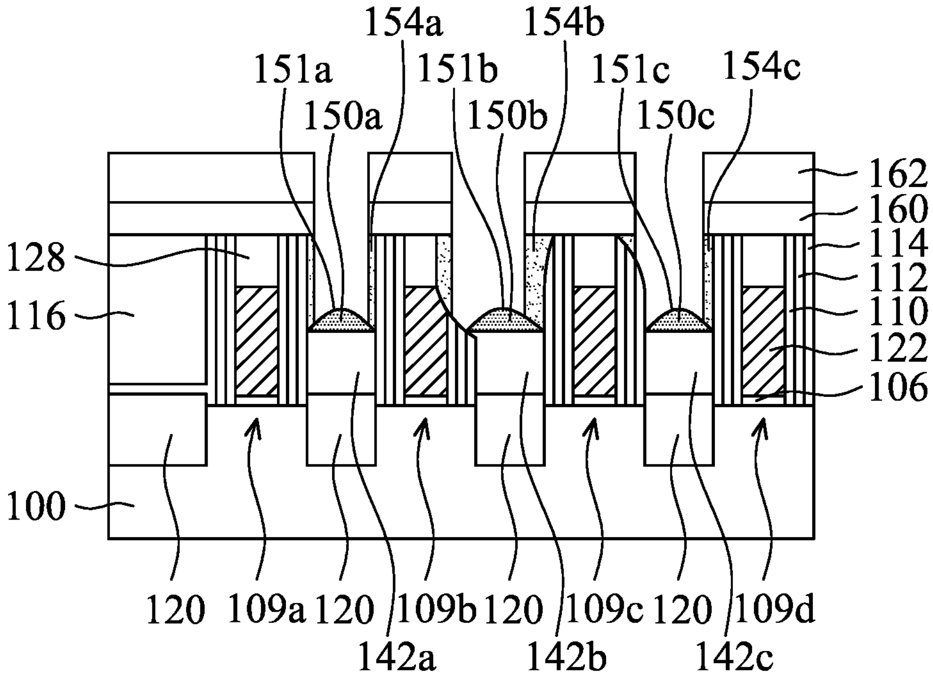
Figure 2N:
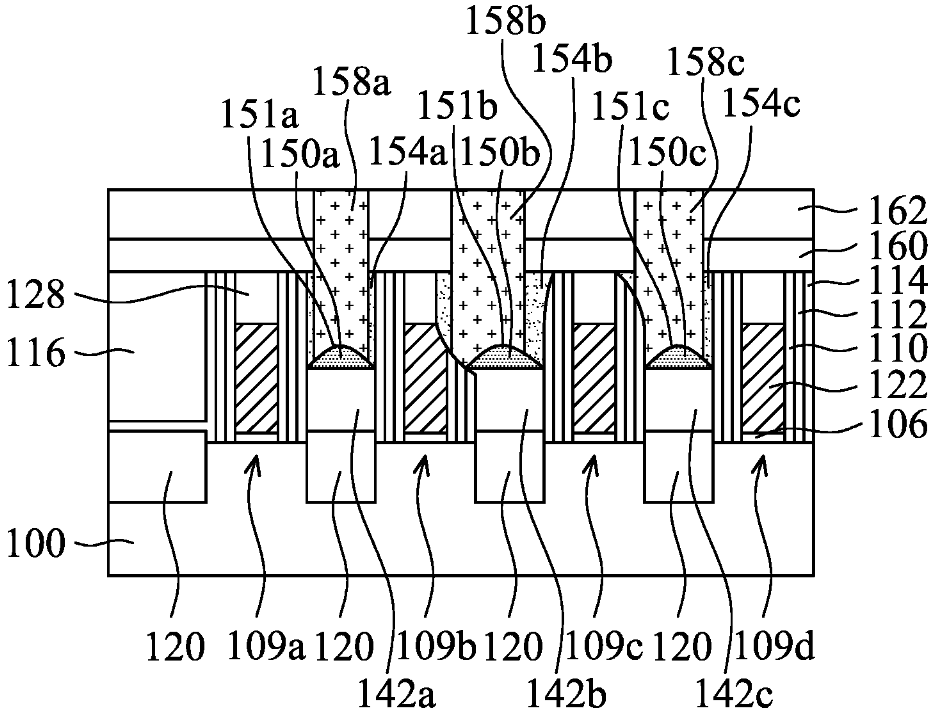

FIGS. 1A to 1B illustrate perspective views of various stages of manufacturing a semiconductor device structure and FIGS. 2A to 2N illustrate cross-sectional representations of various stages of manufacturing the semiconductor device structure in accordance with some embodiments. In addition, FIGS. 2A to 2B illustrate the cross-sectional representations of the semiconductor device structure shown along line 2-2' in FIGS. 1A to 1B in accordance with some embodiments. In some embodiments, the semiconductor device structure is implemented as a fin field effect transistor (FinFET) structure. As show in FIGS. 1A and 2A, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. In some embodiments, the substrate 100 is a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

In some embodiments, the substrate 100 has a PMOS region for P-type FinFETs formed thereon and/or an NMOS region for N-type FinFETs formed thereon. In some embodiments, the PMOS region of the substrate 100 includes Si, SiGe, SiGeB, or an III-V group semiconductor material (such as InSb, GaSb, or InGaSb). The NMOS region of the substrate 100 includes Si, SiP, SiC, SiPC, or an III-V group semiconductor material (such as InP, GaAs, AlAs, InAs, InAlAs, or InGaAs).

Afterwards, a fin structure 102 is formed over a substrate 100 in accordance with some embodiments. In some embodiments, the fin structure 102 is formed by patterning the substrate 100. The fin structure 102 may have slope sidewalls, so that the fin structure 102 has a top portion with a width that is narrower than that of the bottom portion, as shown in FIG. 1A.

After the fin structure 102 is formed, an isolation feature 104, such as an shallow trench isolation (STI) structure, is formed over the substrate 100, as shown in FIG. 1A in accordance with some embodiments. The fin structure 102 is surrounded by the isolation feature 104. The isolation feature 104 may be formed by depositing an dielectric layer (not shown) over the substrate 100 and recessing the dielectric layer. In some embodiments, the isolation feature 104 is made of silicon oxide, silicon nitride, silicon oxynitride, fluorosilicate glass (FSG), low-K dielectric materials, and/or another suitable dielectric material. The insulating liner for formation of the isolation feature 104 may be deposited by a flowable CVD (FCVD) process, a chemical vapor deposition (CVD) process, an atomic layer deposition (ALD) process, or another applicable process.

Next, dummy gate structures 108*a*, 108*b*, 108*c*, and 108*d* are formed across the fin structure 102 over the substrate 100 and cover the isolation feature 104, as shown in FIG. 1A in accordance with some embodiments. Each of the dummy gate structures 108*a*, 108*b*, 108*c*, and 108*d* include a dummy gate dielectric layer 105 and a dummy gate electrode layer 107 formed over the dummy gate dielectric layer 105. The dummy gate dielectric layer 105 may be made of silicon oxide. Moreover, the dummy gate electrode layer 107 may be made of polysilicon.

After the dummy gate structures 108*a*, 108*b*, 108*c*, and 108*d* are formed, gate spacer structures are formed on the opposite sides (e.g., sidewalls) of the dummy gate structures 108*a*, 108*b*, 108*c*, and 108*d*. Each of the gate spacer structures includes a first spacer layer 110 and a second spacer layer 110 stacked on sidewall of one another. The first spacer layer 110 is formed adjacent to the corresponding dummy gate structure, and a second spacer layer 112 is formed adjacent to the first spacer layer 110, as shown in FIGS. 1A and 2A in accordance with some embodiments. The first spacer layer 110 and the second spacer layer 112 may be used for protecting dummy gate structures 109*a*, 109*b*, 109*c*, and 109*d* from damage or loss during subsequent processing. For example, the first spacer layer 120 may be made of a low-K dielectric material, silicon nitride, silicon oxide, silicon oxynitride, silicon carbide, or another applicable dielectric material. The second spacer layer 112 formed on the corresponding first spacer layer 110 may be made of a material that is different from that of the first spacer layer 110. For example, the second spacer layer 112 may be made of silicon nitride, silicon oxide, silicon carbide, silicon oxynitride, or another applicable material.

Afterwards, source/drain (S/D) features (or referred to S/D regions) 120 are formed in the fin structure 102 adjacent to and exposed from the dummy gate structures 108*a*, 108*b*, 108*c*, and 108*d*, as shown in FIGS. 1A and 2A in accordance with some embodiments. In some embodiments, the S/D features 120 is formed by recessing the fin structure 102 exposed from the dummy gate structures 108*a*, 108*b*, 108*c*, and 108*d* and growing semiconductor materials in the formed recesses in the fin structure 102 by performing epitaxial (epi) growth processes. In some embodiments, the semiconductor device structure is an NMOS device, and the S/D feature 120 includes Si, SiP, SiC, SiPC, or an III-V group semiconductor material (such as InP, GaAs, AlAs, InAs, InAlAs, or InGaAs), or the like. In some embodiments, the semiconductor device structure is a PMOS device, and the S/D feature 120 includes Si, SiGe, SiGeB, or an III-V group semiconductor material (such as InSb, GaSb, or InGaSb), or the like. In some embodiments, the S/D features 120 protrude above the isolation feature 104.

After the S/D features 120 are formed, a contact etch stop layer (CESL) 114 and a dielectric layer 116 are formed over the isolation feature 104 and covers the S/D features 120 and the sidewalls of the gate spacer structures, as shown in FIGS. 1B and 2B in accordance with some embodiments. CESL 114 may be formed by a conformal deposition process such as an atomic layer deposition (ALD) process or a chemical vapor deposition (CVD) process, for example. CESL 114 may be made of silicon oxide, silicon nitride, silicon oxynitride, or the like. The dielectric layer 116 (which serves as an interlayer dielectric (ILD) layer) may be made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like, and may be deposited by any suitable method, such as a CVD process, a plasma enhanced CVD (PECVD) process, a flowable CVD (FCVD) process, the like, or a combination thereof. The dielectric layer 116 may be a single layer or include multiple dielectric layers with the same or different dielectric materials.

Afterwards, the dummy gate structures 108*a*, 108*b*, 108*c*, and 108*d* are removed, so as to be replaced by gate structures 109*a*, 109*b*, 109*c*, and 109*d*, as shown in FIGS. 1B and 2B in accordance with some embodiments. In some embodiments, each of the gate structures 109*a*, 109*b*, 109*c*, and 109*d* includes a gate dielectric layer 106, a gate electrode layer 122, and gate spacer structures including the first spacer layer 110 and the second spacer layer 112. In some embodiments, the gate dielectric layer 106 is made of high-K dielectric materials, such as metal oxides, metal nitrides, metal silicates, transition metal-oxides, transition metal-nitrides, transition metal-silicates, or oxynitrides of metals. Examples of the high-K dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or another applicable dielectric material.

In some embodiments, the gate electrode layer 122 is made of a conductive material, such as aluminum, copper, tungsten, titanium, tantalum, or another applicable material. Each of the gate structures 109*a*, 109*b*, 109*c*, and 109*d* may further include a work functional metal layer (not shown) between the gate dielectric layer 106 and the gate electrode layer 122, so that the gate structures 109*a*, 109*b*, 109*c*, and 109*d* have the proper work function values. An exemplary p-type work function metal layer may be made of TiN, TaN, Ru, Mo, Al, WN, $ZrSi_2$, $MoSi_2$, TaSi2, $NiSi_2$, WN, or a combination thereof. An exemplary n-type work function metal layer may be made of Ti, Ag, TaAl, TaAlC, TiAlN, TaC, TaCN, TaSiN, Mn, Zr, or a combination thereof.

Afterwards, each of the gate electrode layers 122 in the gate structures 109*a*, 109*b*, 109*c*, and 109*d* are recessed by etching, so as to form recesses 125, as shown in FIG. 2C in accordance with some embodiments. After recessing the gate electrode layers 122, dielectric capping layers 128 are respectively formed in the recesses 125 (not shown and as indicated in FIG. 2C) over the gate structures 109*a*, 109*b*, 109*c*, and 109*d*, as shown in FIG. 2D in accordance with some embodiments. The dielectric capping layers 128 is used as a hard mask for protecting the gate structures 109*a*, 109*b*, 109*c*, and 109*d* in the subsequent manufacturing processes (e.g., etching processes). The dielectric capping layers 128 may be made of SiON, $Ta_2O_5$, $Al_2O_3$, or $ZrO_2$, and the like, for example.

After the dielectric capping layers 128 are formed, a masking layer 132 is formed over the dielectric layer 116 and the dielectric capping layers 128, as shown in FIG. 2E in accordance with some embodiments. For example, the masking layer 132 may include a tri-layer resist structure including a bottom layer, a middle layer, and a top layer. In order to simplify the diagram, only a flat layer (i.e., the masking layer 132) is depicted. More specifically, the bottom layer is a first layer of the tri-layer resist structure. The bottom layer may contain a material that is patternable and/or have anti-reflection properties. For example, the bottom layer is a bottom anti-reflective coating (BARC) layer, such as a nitrogen-free anti-reflective coating (NFARC) layer. In some embodiments, the bottom layer is formed by a spin-on coating process, a CVD process, a physical vapor deposition (PVD) process, or another suitable deposition process. The middle layer is formed over the bottom layer and is a second layer of the tri-layer resist structure. The middle layer (which is also referred to as a hard mask) provides hard mask properties for the photolithography process. In addition, the middle layer is designed to provide etching selectivity from the bottom layer and the top layer. For example, the middle layer is made of silicon nitride, silicon oxynitride or silicon oxide and is formed by a spin-on coating process, a CVD process, a PVD process, or another suitable deposition process. The top layer is formed over the middle layer and is a third layer of the tri-layer resist structure. The top layer may be positive photoresist or negative photoresist. Alternatively, the tri-layer resist structure includes oxide-nitride-oxide (ONO) layers.

Afterwards, the tri-layer resist structure (i.e., the masking layer 132) is patterned to sever as an etch mask for forming self-aligned openings 135*a*, 135*b*, and 135*c* which are formed through the masking layer 132, the dielectric layer 116 and the portion of the CESL 114 underlying the dielectric layer 116 to expose the top surfaces of some S/D features 120, as shown in FIG. 2F in accordance with some embodiments. In some embodiments, the self-aligned openings 135*a*, 135*b*, and 135*c* are formed by etching the dielectric layer 116 and the portion of the CESL 114 underlying the dielectric layer 116 using the patterned masking layer 132 as an etch mask, so as to define some source/drain contact regions between the gate structures 109*a*, 109*b*, 109*c*, and 109*d*. The remaining CESL 114 in the self-aligned openings 135*a*, 135*b*, and 135*c* serve as a third spacer layer stacked on the second spacer layer 112 of the gate spacer structure. In those cases, the first spacer layer 110 is separated from the third spacer layer by the second spacer layer 112.

For illustrative purposes, FIG. 2F shows self-aligned openings 135*a*, 135*b*, and 135*c* with different sidewall profiles formed after the definition of the some source/drain contact regions. More specifically, the self-aligned opening 135*a* with vertical sidewalls represents an ideal case where the masking layer 132 around the self-aligned opening 135*a* is substantially not lost during the definition of the some source/drain contact regions by etching. Moreover, the self-aligned opening 135*b* with a funnel-like sidewall profile represents a case where portions of the masking layer 132, the dielectric capping layer 128, the top of the gate electrode layer 122, and the top of the gate spacer structure (which includes the first spacer layer 110, the second spacer layer 112, and the third spacer layer (i.e., the remaining CESL 114)) around the self-aligned opening 135*b* are lost during the definition of the some source/drain contact regions by etching. In addition, the self-aligned opening 135*c* with a funnel-like sidewall profile represents a case where portions of the masking layer 132 and the top of the gate spacer structure (which includes the first spacer layer 110, the second spacer layer 112, and the third spacer layer) around the self-aligned opening 135*c* are lost during the definition of the some source/drain contact regions by etching. In some embodiments, in the self-aligned openings 135*b* and 135*c*, the top surface of the first gate spacer layer 110 is lower than the top surface of the corresponding gate electrode layer 122 and higher than the top surface of the second gate spacer layer 112. Moreover, in the self-aligned openings 135*b* and 135*c*, the top surface of the third gate spacer layer (i.e., the remaining CESL 114) is also lower than the top surface of the second gate spacer layer 112.

The source/drain contact regions defined by the self-aligned openings 135*a*, 135*b*, and 135*c* provide the maximum critical dimension (CD) compared to cases where the source/drain contact regions are defined by a non-self-aligned opening. As a result, the resistance (e.g., contact resistance) of the subsequently formed contact structure in those source/drain contact regions defined by the self-aligned openings 135*a*, 135*b*, and 135*c* can be reduced.

After forming the self-aligned openings 135*a*, 135*b*, and 135*c*, a salicide process may be optionally performed to form salicide layers (not shown) over the exposed upper surfaces of the S/D features 120. In some embodiments, the salicide layers may be formed by forming a metal layer over the upper surfaces of the S/D features 120. Afterwards, an annealing process is performed on the metal layer so the metal layer reacts with the S/D features 120. Afterwards, the unreacted metal layer is removed to form the salicide layers. Examples for forming the metal layer includes Ti, Co, Ni, NiCo, Pt, Ni(Pt), Ir, Pt(Ir), Er, Yb, Pd, Rh, Nb, TiSiN, and the like.

After the salicide layers (if presented) are formed, a conductive material 138 is formed over the masking layer 132 and fills the self-aligned openings 135*a*, 135*b*, and 135*c*, as shown in FIG. 2G in accordance with some embodiments. In some embodiments, the conductive material 138 filled in the self-aligned openings 135*a*, 135*b*, and 135*c* is electrically connected to the S/D features 120. The conductive material 138 may be made of Co, W, Mo, Ru, Ni, Rh, Al, Cu, or metal compound, or the like. The conductive material 138 may be formed by a CVD process, a PVD process, an ALD process, an electroless deposition (ELD) process, an electrochemical plating (ECP) process, or another applicable process.

Afterwards, a planarization process is performed to remove the excess conductive material 138 and the masking layer 132 above the dielectric capping layers 128, as shown in FIG. 2H in accordance with some embodiments. The planarization process is performed on the conductive material 138 until the dielectric capping layers 128 and the dielectric layer 116 are exposed. In some embodiments, the planarization process includes a chemical mechanical polishing (CMP) process.

After the planarization process, the remaining conductive material 138 in the self-aligned openings 135*b*, and 135*c* may be in direct contact with or very close to the top of the gate electrode layers 122 exposed form the self-aligned openings 135*b*, and 135*c*. As a result, the exposed portion of the gate electrode layer 122 and the remaining conductive material 138 (which may be employed as an S/D contact) may be accidentally shorted to make the semiconductor device fail.

Consequently, the remaining conductive materials 138 in the self-aligned openings 135*a*, 135*b*, and 135*c* are recessed by etching, so that the top surfaces of the remaining conductive materials 138 are lower than the top surfaces of the gate electrode layers 122, as shown in FIG. 2I in accordance with some embodiments. The recessed conductive materials 138 in the self-aligned openings 135*a*, 135*b*, and 135*c* form conductive layers 142*a*, 142*b*, and 142*c*. In some embodiments, each of the conductive layers 142*a*, 142*b*, and 142*c* serves as a base portion of the subsequently formed S/D contact structure. As described previously, the exposed portion of the gate electrode layer 122 and the remaining conductive material 138 may be accidentally shorted. However, in some embodiments, the conductive layers 142*b*, and 142*c* are not in direct contact with the corresponding gate electrode layers 122, and therefore, the short between the gate electrode layer and the S/D contact structure can be prevented. For example, a portion of the conductive layer 142*b* laterally extends to cover the top surface of the third spacer layer, so that the corresponding gate electrode layer 122 is electrically isolated from the conductive layer 142*b* by the first and second spacer layers 110 and 112.

After the conductive layers 142*a*, 142*b*, and 142*c* are formed, a conductive capping layer 150*a* with a convex top surface 151*a* is formed to cover the top surface of the conductive layer 142*a*; a conductive capping layer 150*b* with a convex top surface 151*b* is formed to cover the top surface of the conductive layer 142*b*; and a conductive capping layer 150*c* with a convex top surface 151*c* is formed to cover the top surface of the conductive layer 142*c*, as shown in FIG. 2J in accordance with some embodiments. In some embodiments, the convex top surfaces 151*a*, 151*b* and 151*c* are arch-shaped, so those top surfaces 151*a*, 151*b* and 151*c* are also referred to arched top surfaces. That is, the central portion of the convex top surfaces 151*a*, 151*b* and 151*c* of the conductive capping layers 150*a*, 150*b* and 150*c* are higher than the edge portion of the convex top surfaces 151*a*, 151*b* and 151*c* of the conductive capping layers 150*a*, 150*b* and 150*c*.

Each of the formed conductive capping layers 150*a*, 150*b*, and 150*c* serves as a conductive capping portion over the base portion of the subsequently formed S/D contact structure. In some embodiments, the top surface 151*a* of the conductive capping portion (i.e., the conductive capping layer 150*a*), the top surface 151*b* of the conductive capping portion (i.e., the conductive capping layer 150*b*), and the top surface 151*c* of the conductive capping portion (i.e., the conductive capping layer 150*c*) are lower than the top surface of the corresponding gate electrode layers 122. As a result, the top surface of the formed S/D contact structure (which includes the lower conductive base portion and the upper conductive capping portion) is lower than the top surface of the corresponding gate electrode layer, so as to prevent the short between the gate electrode layer and the S/D contact structure.

In some embodiments, the angle θ between the top surface of the conductive base portion and the arched top surface of the conductive capping portion is greater than 0 and less than 90°. Moreover, the maximum height H of the conductive capping portion is less than 5 nm. The conductive capping portions (e.g., conductive capping layers 150*a*, 150*b*, and 150*c*) may be formed by a selectively growth/deposition process and made of a material that is the same as or different than the material of the conductive base portion (e.g., conductive layers 142*a*, 142*b*, and 142*c*). For example, the conductive capping portions may be made of Co, W, Mo, Ru, Ni, Rh, Al, Cu, or metal compound, or the like.

FIG. 2K illustrates the deposition of dielectric capping layers 154*a*, 154*b*, and 154*c* over the corresponding S/D contact structures to fill self-aligned openings 135*a*, 135*b*, and 135*c*, respectively, in accordance with some embodiments. As shown in FIG. 2K, the top surfaces of the dielectric capping layer 154*a*, 154*b*, and 154*c* are substantially level with the top surfaces of the dielectric capping layer 128 and the dielectric layer 116. Moreover, the bottom surfaces of the dielectric capping layers 128 are higher than the convex top surfaces 151*a*, 151*b*, and 151*c* of the corresponding conductive capping layers 150*a*, 150*b*, and 150*c*. In some embodiments, the top surfaces of the dielectric layer 262 are substantially level with the top surfaces of the formed dielectric capping layers 154*a*, 154*b*, and 154*c*. Moreover, the dielectric capping layers 154*a*, 154*b*, and 154*c* are in direct contact with the corresponding dielectric capping layers 128 and separate the corresponding gate spacer structures from the corresponding dielectric capping layers 128.

In some embodiments, the formed dielectric capping layer is in contact with the corresponding gate electrode layer 122 and the top surface of the corresponding gate spacer structure and/or the corresponding gate electrode layer 122. For example, the dielectric capping layer 154*b* is in contact with the corresponding gate electrode layer 122 and the top surface of the corresponding first and second gate spacer structures 110 and 112. In some embodiments, the formed dielectric capping layer is in contact with the top surface of the corresponding gate spacer structure. For example, the dielectric capping layer 154*c* is in contact with the top surfaces of the corresponding second spacer layer 112, and the corresponding third spacer layer.

The formation of the dielectric capping layers 154*a*, 154*b*, and 154*c* includes forming a dielectric material (not shown) over the dielectric capping layers 128 and the dielectric layer 116 and fills the self-aligned openings 135*a*, 135*b*, and 135*c*. Afterwards, a planarization process (such as CMP process) is performed to remove the excess dielectric material above the dielectric capping layers 128 and the dielectric layer 116, so as to form the dielectric capping layers 154*a*, 154*b*, and 154*c* to cover the corresponding S/D contact structure. As a result, the top surfaces of the capping layers 128 and the dielectric layer 116 are substantially level with the top surfaces of the formed dielectric capping layers 154*a*, 154*b*, and 154*c*. The dielectric material used for the formation of the dielectric capping layers 154*a*, 154*b*, and 154*c* may be made of a dielectric material including $Si_xO_y$, $Al_xO_y$, $Si_xO_y$, $Hf_xO_y$, $Mg_xO_y$, $Zr_xO_y$, $Ti_xO_y$, $Ta_xO_y$, or the like, and may be deposited by any suitable method, such as a CVD process, a PECVD process, an FCVD process, the like, or a combination thereof. The dielectric material may be a single layer or include multiple dielectric layers with the same or different dielectric materials.

After forming the dielectric capping layers, the exposed of the gate electrode layers during the definition of the some source/drain contact regions by etching can be covered and protected by the dielectric capping layers. Moreover, the formed space due to the loss of the gate spacer structures during the definition of the some source/drain contact regions by etching can be filled with the dielectric capping layers. For example, the formed dielectric capping layer 154*c* compensates the loss of the gate spacer structures during the etching. Similarly, the formed dielectric capping layer 154*b* covers and protects the exposed gate electrode layer 122 and fills the formed space due to the loss of the gate spacer structures during the etching.

After forming the dielectric capping layers 154*a*, 154*b*, and 154*c*, via openings that passes through the dielectric capping layers 154*a*, 154*b*, and 154*c*, and the insulating capping layers 154*a*, 154*b*, and 154*c* are formed, so as to expose the top surface 151*a* of the conductive capping layer 150*a*, the top surface 151*b* of the conductive capping layer 150*b*, and the top surface 151*c* of the conductive capping layer 150*c*, as shown in FIG. 2M in accordance with some embodiments. In some embodiments, those via openings are formed by performing photolithography and etching processes. For example, an etching process may be performed using the dielectric layer 162 as an etch stop layer after the photolithography process, so that an opening through the dielectric layer 162 is formed and the dielectric layer 160 is exposed. Afterwards, one or more etching processes may be performed to etch the dielectric layer 160 and the underlying insulating capping layers 154*a*, 154*b*, and 154*c*.

Afterwards, dielectric layers 160 and 162 are successively formed over the dielectric layer 116 and cover the dielectric capping layers 128, as shown in FIG. 2L in accordance with some embodiments. In some embodiments, the dielectric layer 160 serves as an etch stop layer and is made of SiN, SiCN, SiOC, SiON, SiCN, or SiOCN. The dielectric layer 160 may be formed by performing a CVD process, a PECVD process, a low pressure CVD (LPCVD) process, an ALD process, or another applicable process.

In some embodiments, the dielectric layer 162 includes a single layer or multilayers. The dielectric layer 162 serves as an interlayer dielectric (ILD) layer and is made of silicon oxide, TEOS oxide, PSG, BSG, BPSG, FSG, USG, or the like. The dielectric layer 162 may be formed by a CVD process, a PECVD process, an FCVD process, a PVD process, an ALD process, a spin-on coating process, the like, or a combination thereof.

After forming the dielectric layer 162, via openings that passes through the dielectric layer 162, the dielectric layer 160, and the insulating capping layers 154*a*, 154*b*, and 154*c* are formed, so as to expose the top surface 151*a* of the conductive capping layer 150*a*, the top surface 151*b* of the conductive capping layer 150*b*, and the top surface 151*c* of the conductive capping layer 150*c*, as shown in FIG. 2M in accordance with some embodiments. In some embodiments, those via openings are formed by performing photolithography and etching processes. For example, an etching process may be performed using the dielectric layer 162 as an etch stop layer after the photolithography process, so that openings through the dielectric layer 162 are formed and the dielectric layer 160 is exposed. Afterwards, one or more etching processes may be performed to etch the dielectric layer 160 and the underlying insulating capping layers 154*a*, 154*b*, and 154*c*.

For illustrative purposes, FIG. 2M shows via openings with and without misalignment during such photolithography and etching processes. More specifically, the via opening formed in the insulating capping layer 154*a* represents an ideal case without misalignment. Moreover, the via openings formed in the insulating capping layers 154*b* and 154*c* represent some cases with misalignment. In those cases with misalignment, the via openings formed in the insulating capping layers 154*b* and 154*c* does not expose the corresponding gate electrode layers 122 due to the protection from the insulating capping layers 150*b* and 150*c*.

After the via openings are formed, conductive via structures 158*a*, 158*b*, and 158*c* are formed to fill those via openings in the insulating capping layers 154*a*, 154*b*, and 154*c*, as shown in FIG. 2N in accordance with some embodiments. More specifically, a conductive material layer (not shown) is formed over the dielectric layer 162 and fills the via openings in the insulating capping layers 154*a*, 154*b*, and 154*c*. In some embodiments, the conductive material layer is made of Co, W, Mo, Ru, Ni, Rh, Al, Cu, or metal compound, or the like. The conductive material layer may be formed by a CVD process, a PVD process, an ALD process, a ELD process, a ECP process, or another applicable process.

Afterwards, a planarization process (such as CMP process) is performed on the conductive material layer until the top surface of the dielectric layer 162 is exposed in accordance with some embodiments. After the planarization process, the remaining conductive material layer in the insulating capping layers 154*a*, 154*b*, and 154*c* forms conductive via structures 158*a*, 158*b*, and 158*c* that are in direct contact with and electrically connected to the convex (or arch-shaped) top surfaces 151*a*, 151*b* and 151*c* of the conductive capping layers 150*a*, 150*b* and 150*c*. As a result, the S/D contact structures with a convex (or arch-shaped) top surface are formed. The S/D contact structure with a convex top surface can provide larger contact area for the overlying via structure than the conventional S/D contact structure with a flat top surface, thereby reducing the contact resistance between the S/D contact structure and the corresponding via structure.

Many variations and/or modifications can be made to embodiments of the disclosure. For example, the manufacturing method in FIGS. 2A to 2N shows that the definition of the some source/drain contact regions by etching using dielectric capping layers as hard masks for protection of the underlying gate electrode layers, but embodiments of the disclosure are not limited. FIGS. 3A to 3H show cross-sectional views of various stages of forming a semiconductor device structure, in accordance with some embodiments. The manufacturing method shown in FIGS. 3A to 3H is similar to the manufacturing method in FIGS. 2A to 2N. In some embodiments, the materials, formation methods, and/or benefits of the semiconductor device structure shown in FIGS. 2A to 2N can also be applied in the embodiments illustrated in FIGS. 3A to 3H, and may be therefore not repeated.

Figure 3A:
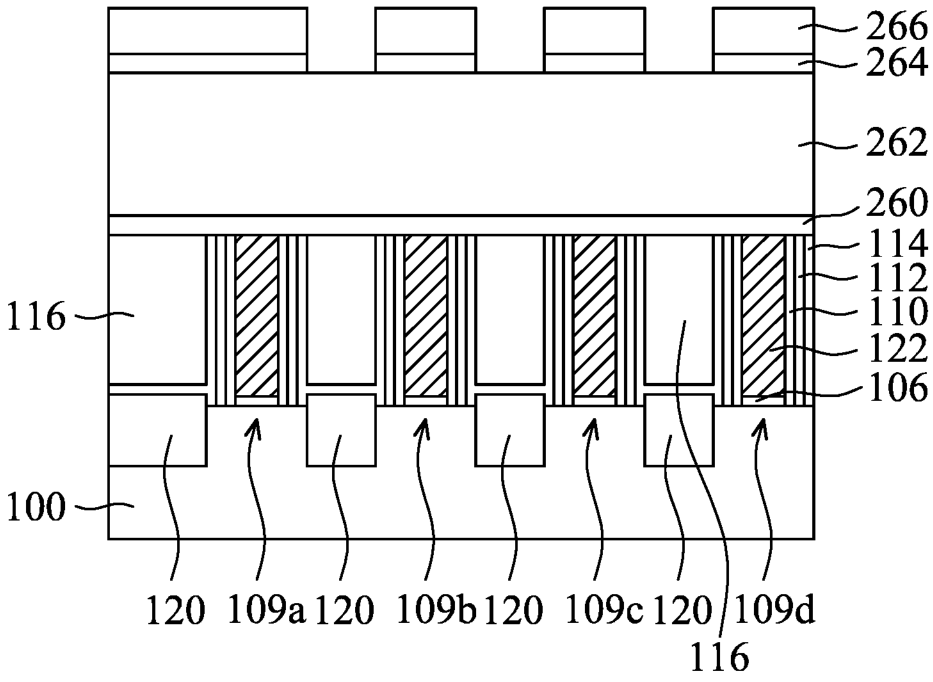
FIGS. 3A to 3H show cross-sectional views of various stages of forming a semiconductor device structure, in accordance with some embodiments.

Unlike the manufacturing method in FIGS. 2A to 2N, the manufacturing method in FIGS. 3A to 3H show that the definition of the some source/drain contact regions by etching without using dielectric capping layers as hard masks for protection of the underlying gate electrode layers. Referring to FIG. 3A, a structure as shown in FIG. 2A is provided. Afterwards, multiple dielectric layers 260, 262, 264, and 266 are successively deposited over the dielectric layer 116, the gate electrode layer 122 and the gate spacer structures, in accordance with some embodiments. In some embodiments, the dielectric layer 260 is used as a hard mask for protecting the gate structures 109*a*, 109*b*, 109*c*, and 109*d* in the subsequent manufacturing processes (e.g., etching processes). The dielectric layer 260 may be made of SiN, SiCN, SiOC, SiON, SiCN, SiOCN or the like. Moreover, the dielectric layer 260 may be formed by performing a CVD process, a PECVD process, an LPCVD process, an ALD process, or another applicable process. The dielectric layer 262 is used as a hard mask for protecting the gate structures 109*a*, 109*b*, 109*c*, and 109*d* in the subsequent manufacturing processes (e.g., etching processes). The dielectric layer 262 may include a single layer or multilayers. The dielectric layer 262 serves as an ILD layer. The dielectric layer 262 may be formed by a CVD process, a PECVD process, an FCVD process, a PVD process, an ALD process, a spin-on coating process, the like, or a combination thereof. The dielectric layers 264 and 266 may serve as a masking structure for definition of S/D contact openings. The masking structure may be made of silicon oxide, silicon nitride, SiCN, SiOC, SiON, SiCN, SiOCN or the like or a combination thereof. The dielectric layers 264 and 266 may be formed by a CVD process, a PECVD process, an LPCVD process, an ALD process, or another applicable process.

Afterwards, the masking structure including the dielectric layers 266 and 264 is patterned to form self-aligned S/D contact opening patterns therein and expose the underlying dielectric layer 262 directly above some of S/D features 120.

Figure 3B:
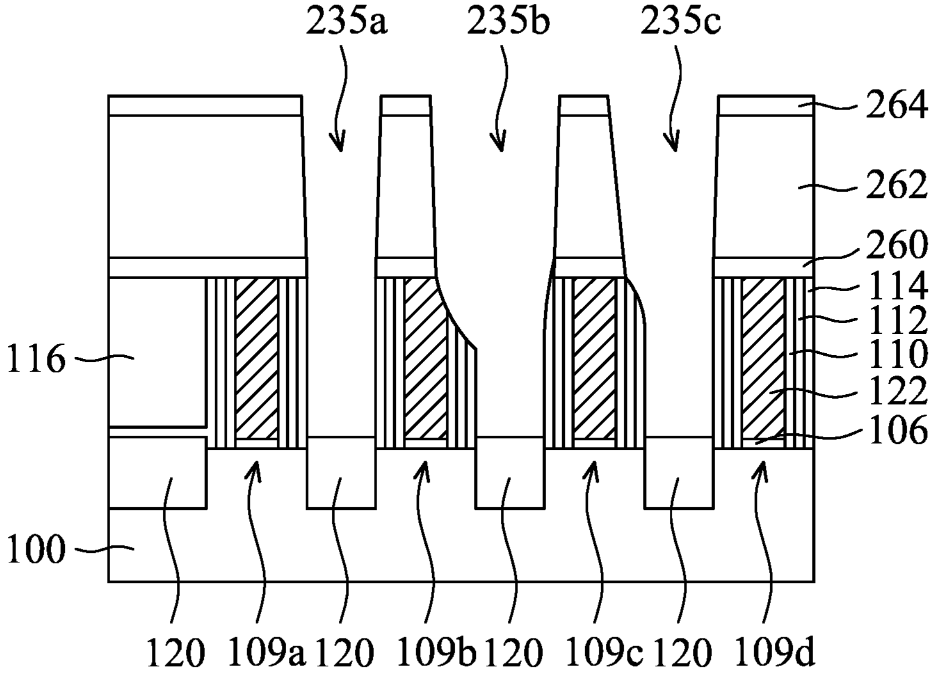

The exposed portions of the dielectric layer 262, the underlying dielectric layers 260 and 116, and the CESL 114 below the dielectric layer 116 are etched using the patterned masking structure as an etch mask, to expose the top surfaces of the S/D features 120, as shown in FIG. 3B in accordance with some embodiments. In some embodiments, self-aligned openings 235*a*, 235*b*, and 235*c* are formed after etching the dielectric layers 262, 260 and 116 and the CESL 114, so as to define some source/drain contact regions between the gate structures 109*a*, 109*b*, 109*c*, and 109*d*. The remaining CESL 114 in the self-aligned openings 235*a*, 235*b*, and 235*c* serve as a third spacer layer of the gate spacer structure. During the etching, the dielectric layer 266 in the masking structure may be fully consumed to expose the top surface of the dielectric layer 264.

For illustrative purposes, FIG. 3B shows self-aligned openings 235*a*, 235*b*, and 235*c* with different sidewall profiles formed after the definition of the some source/drain contact regions. Similar to the self-aligned openings 135*a*, 135*b*, and 135*c* shown in FIG. 2F, the self-aligned S/D contact opening 235*a* with vertical sidewalls represents an ideal case where the dielectric layer 260 on the corresponding gate electrode layer and the corresponding gate spacer structure is substantially not lost during the definition of the some source/drain contact regions by etching. Moreover, the self-aligned opening 235*b* with a funnel-like sidewall profile represents a case where portions of the dielectric layer 260, the top of the gate electrode layer 122, and the top of the gate spacer structure around the self-aligned opening 235*b* are lost during the definition of the some source/drain contact regions by etching. In addition, the self-aligned opening 235*c* with a funnel-like sidewall profile represents a case where portions of the masking layer 132 and the top of the gate spacer structure around the self-aligned opening 235*c* are lost during the definition of the some source/drain contact regions by etching.

Figure 3C:
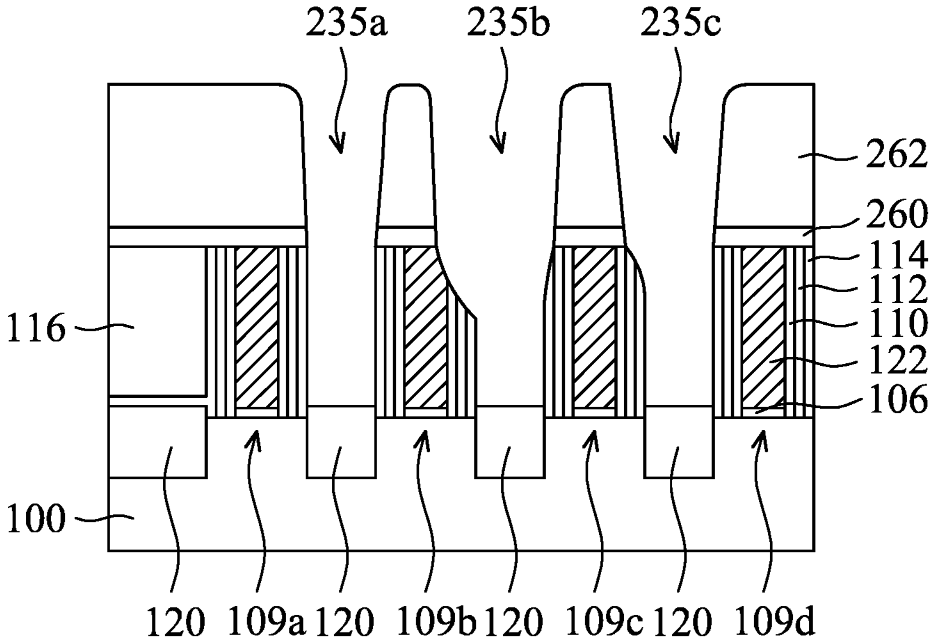

Afterwards, one or more etching processes are performed on the structure shown in FIG. 3C in accordance with some embodiments. For example, multiple etching processes are performed to remove the remaining masking structure (i.e., the dielectric layer 264), so that the top surface of the dielectric layer 262 is exposed. Moreover, the top corners of the self-aligned openings 235*a*, 235*b*, and 235*c* are also rounded to increase the gap-filling ability for subsequent formation of S/D contact structures.

Figure 3D:
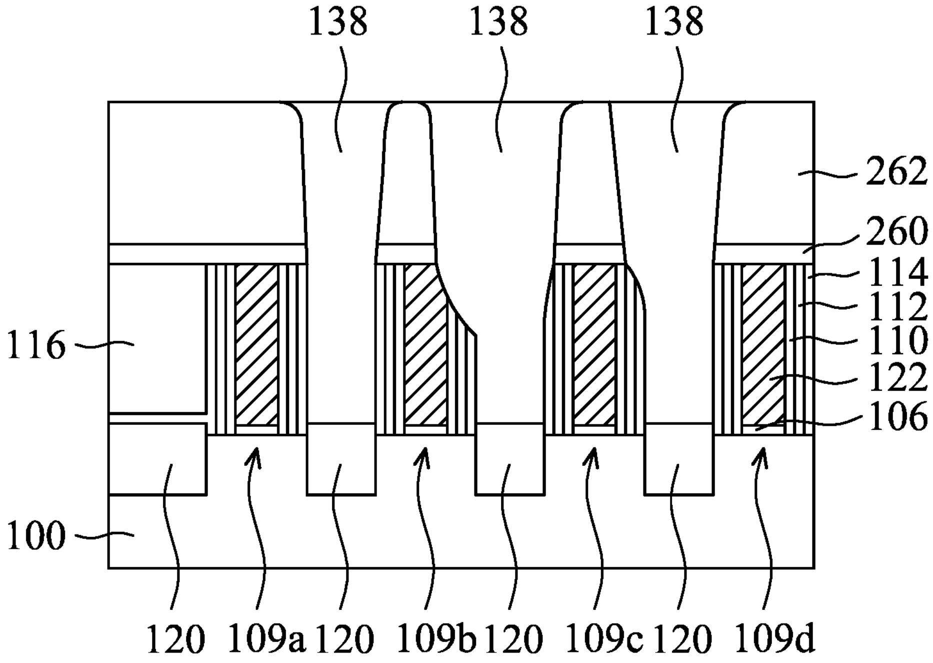

After the top corners of the self-aligned openings 235*a*, 235*b*, and 235*c* are rounded, each of the self-aligned openings 235*a*, 235*b*, and 235*c* is filled with a conductive material 138, as shown in FIG. 3D in accordance with some embodiments. More specifically, after forming the self-aligned openings 235*a*, 235*b*, and 235*c*, a salicide process may be optionally performed to form salicide layers (not shown) over the exposed upper surfaces of the S/D features 120, in accordance with some embodiments.

Afterwards, a conductive material 138 is formed over the dielectric layer 262 and fills the self-aligned openings 235*a*, 235*b*, and 235*c*, in accordance with some embodiments. A planarization process (such as CMP process) is performed to remove the excess conductive material 138 above the dielectric layer 262, as shown in FIG. 3D in accordance with some embodiments. The planarization process is performed on the conductive material 138 until the dielectric layer 262 is exposed. Afterwards, an additional planarization process (such as CMP process) is performed on the structure shown in FIG. 3D, to remove the rounded portions of the dielectric layer 262 and reduce the height of the remaining conductive material 138 in each of the self-aligned openings 235*a*, 235*b*, and 235*c*, as shown in FIG. 3E in accordance with some embodiments.

Figure 3E:
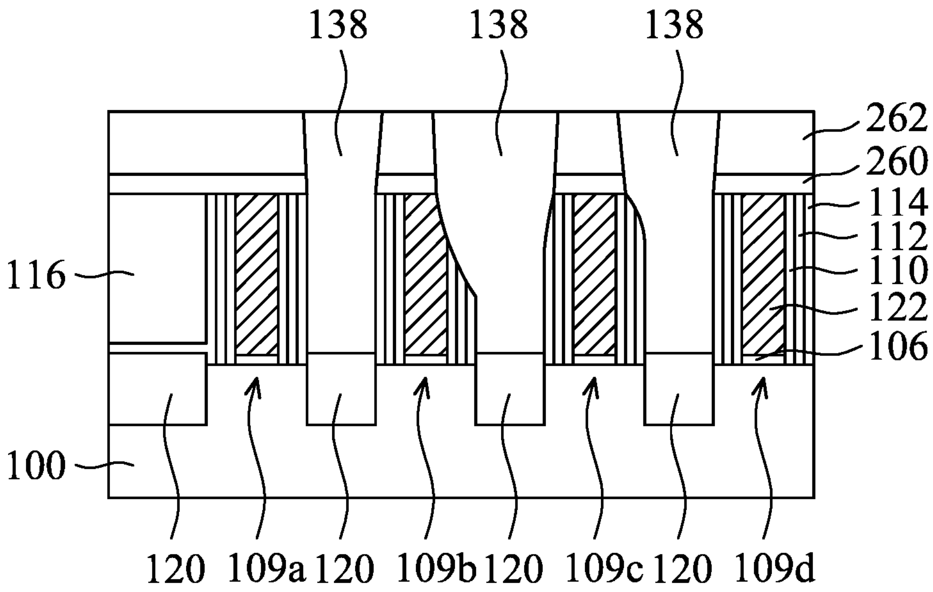

As shown in FIG. 3E, the remaining conductive material 138 in the self-aligned openings 235*b*, and 235*c* may be in direct contact with or very close to the top of the gate electrode layers 122 exposed form the self-aligned openings 235*b*, and 235*c*. As a result, the exposed portion of the gate electrode layer 122 and the remaining conductive material 138 may be accidentally shorted to make the semiconductor device fail.

Figure 3F:
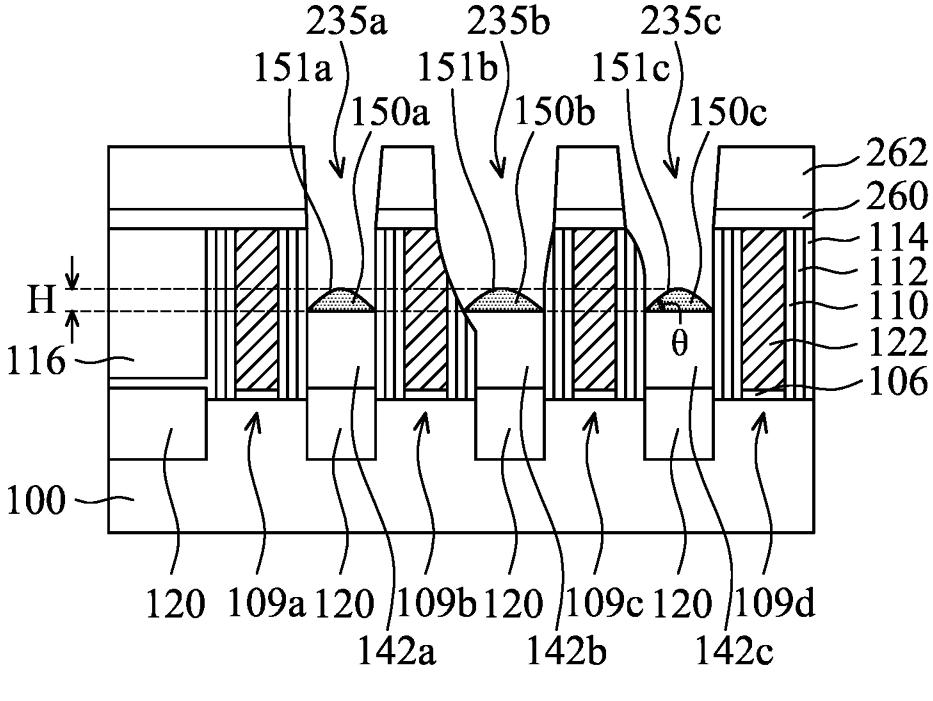

Consequently, the remaining conductive materials 138 in the self-aligned openings 135*a*, 135*b*, and 135*c* are further recessed by etching, so that the top surfaces of the remaining conductive materials 138 are lower than the top surfaces of the gate electrode layers 122, as shown in FIG. 3F in accordance with some embodiments. The recessed conductive materials 138 in the self-aligned openings 235*a*, 235*b*, and 235*c* form conductive layers 142*a*, 142*b*, and 142*c*. Since the conductive layers 142*b*, and 142*c* are not in direct contact with the corresponding gate electrode layers 122, the short between the gate electrode layer and the S/D contact structure can be prevented.

Afterwards, a conductive capping layer 150*a* with a convex top surface 151*a* is formed to cover the top surface of the conductive layer 142*a*; a conductive capping layer 150*b* with a convex top surface 151*b* is formed to cover the top surface of the conductive layer 142*b*; and a conductive capping layer 150*c* with a convex top surface 151*c* is formed to cover the top surface of the conductive layer 142*c*.

In some embodiments, the top surface 151*a* of the conductive capping portion (i.e., the conductive capping layer 150*a*), the top surface 151*b* of the conductive capping portion (i.e., the conductive capping layer 150*b*), and the top surface 151*c* of the conductive capping portion (i.e., the conductive capping layer 150*c*) are lower than the top surface of the corresponding gate electrode layers 122. As a result, the top surface of the formed S/D contact structure is lower than the top surface of the corresponding gate electrode layer, so as to prevent the short between the gate electrode layer and the S/D contact structure.

In some embodiments, the angle θ between the top surface of the conductive base portion and the arched top surface of the conductive capping portion is greater than 0 and less than 90°. Moreover, the maximum height H of the conductive capping portion is less than 5 nm.

Figure 3G:
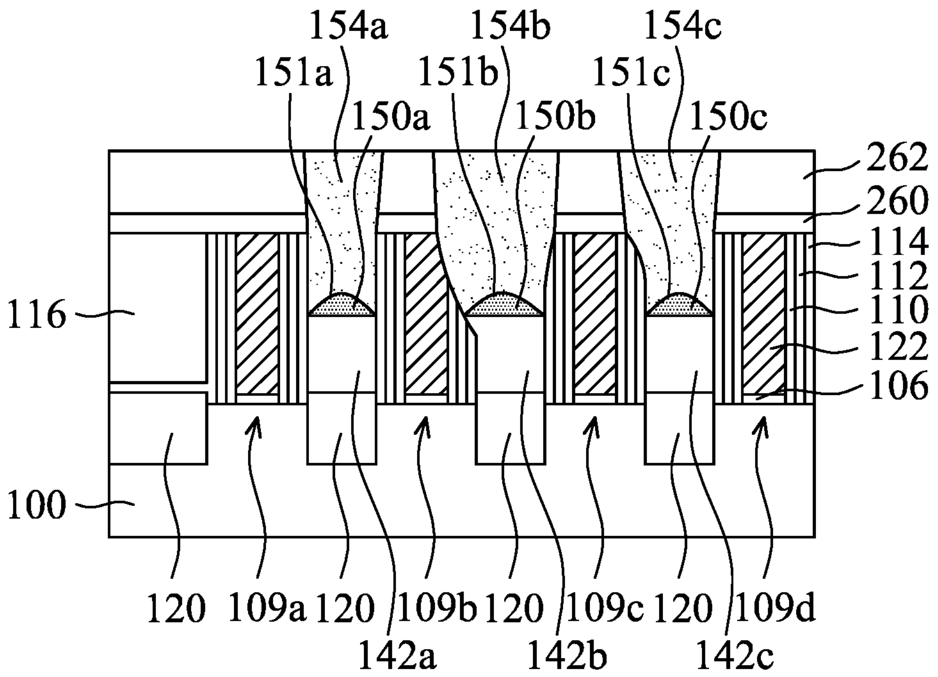
Figure 3H:
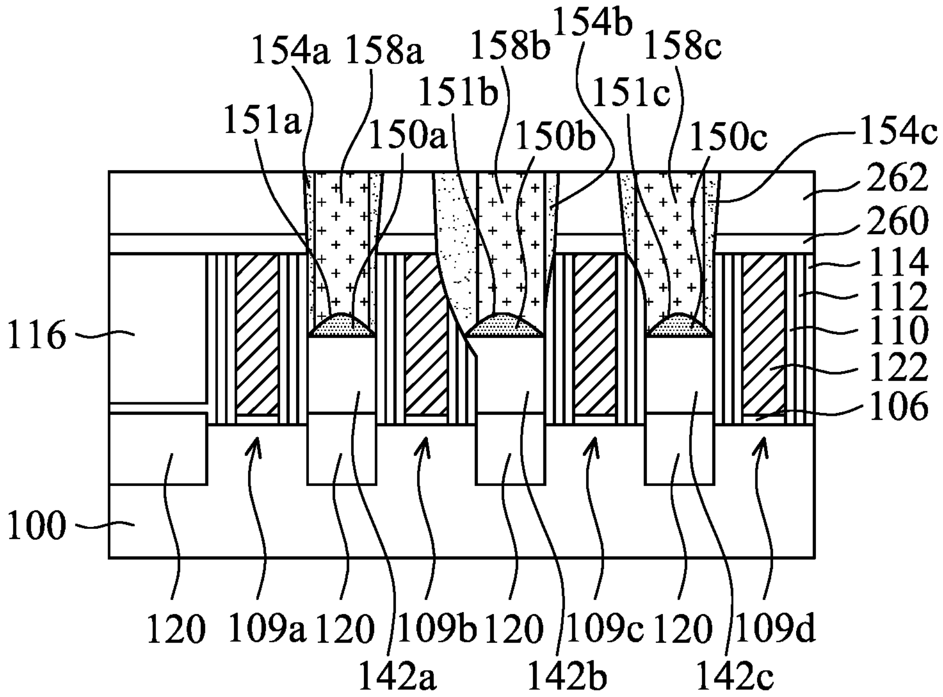

FIG. 3G illustrates the deposition of dielectric capping layers 154*a*, 154*b*, and 154*c* over the corresponding S/D contact structures to fill self-aligned openings 235*a*, 235*b*, and 235*c*, respectively, in accordance with some embodiments. As shown in FIG. 3G, the top surfaces of the dielectric capping layer 154*a*, 154*b*, and 154*c* are substantially level with the top surfaces of the dielectric layer 262 and protrude above the top surfaces of the gate electrode layers 122 and the dielectric layer 116.

In some embodiments, the formed dielectric capping layer is in contact with the corresponding gate electrode layer 122 and the top surface of the corresponding gate spacer structure and/or the corresponding gate electrode layer 122. For example, the dielectric capping layer 154*b* is in contact with the corresponding gate electrode layer 122 and the top surface of the corresponding first and second gate spacer structures 110 and 112. In some embodiments, the formed dielectric capping layer is in contact with the top surface of the corresponding gate spacer structure. For example, the dielectric capping layer 154*c* is in contact with the top surfaces of the corresponding second spacer layer 112, and the corresponding third spacer layer.

The formation of the dielectric capping layers 154*a*, 154*b*, and 154*c* includes forming a dielectric material (not shown) over the dielectric layer 262 and fills the self-aligned openings 235*a*, 235*b*, and 235*c*. Afterwards, a planarization process (such as CMP process) is performed to remove the excess dielectric material above the dielectric layer 262, so as to form the dielectric capping layers 154*a*, 154*b*, and 154*c* to cover the corresponding S/D contact structure. As a result, the top surface of the dielectric layer 262 is substantially level with the top surfaces of the formed dielectric capping layers 154*a*, 154*b*, and 154*c*.

After forming the dielectric capping layers, the exposed of the gate electrode layers during the definition of the some source/drain contact regions by etching can be covered and protected by the dielectric capping layers. Moreover, the formed space due to the loss of the gate spacer structures during the definition of the some source/drain contact regions by etching can be filled with the dielectric capping layers. For example, the formed dielectric capping layer 154*c* compensates the loss of the gate spacer structures during the etching. Similarly, the formed dielectric capping layer 154*b* covers and protects the exposed gate electrode layer 122 and fills the formed space due to the loss of the gate spacer structures during the etching.

Afterwards, via openings that pass through the insulating capping layers 154*a*, 154*b*, and 154*c* are formed, so as to expose the top surface 151*a* of the conductive capping layer 150*a*, the top surface 151*b* of the conductive capping layer 150*b*, and the top surface 151*c* of the conductive capping layer 150*c*. After the via openings are formed, conductive via structures 158*a*, 158*b*, and 158*c* are formed to fill those via openings in the insulating capping layers 154*a*, 154*b*, and 154*c*, as shown in FIG. 2N in accordance with some embodiments. The conductive via structures 158*a*, 158*b*, and 158*c* are in direct contact with and electrically connected to the convex (or arch-shaped) top surfaces 151*a*, 151*b* and 151*c* of the conductive capping layers 150*a*, 150*b* and 150*c*. As a result, the S/D contact structures with a convex (or arch-shaped) top surface are formed. The S/D contact structure with a convex top surface can provide larger contact area for the overlying via structure than the conventional S/D contact structure with a flat top surface, thereby reducing the contact resistance between the S/D contact structure and the corresponding via structure.

Embodiments of semiconductor device structures and methods for forming the same are provided. The formation of the semiconductor device structure includes forming a conductive layer adjacent to a gate electrode layer. Afterwards, the conductive layer is recessed, so that the top surface of the recessed conductive layer is lower than the top surface of the gate electrode layer. Afterwards, a conductive capping layer with an arched top surface and a dielectric capping layer are successively formed over the recessed conductive layer. The arched top surface of the conductive capping layer is also lower than the top surface of the gate electrode layer. The recessed conductive layer and the overlying conductive capping layer collectively form an S/D contact structure with an arched top surface. In the semiconductor device structure, the arched top surface of the S/D contact structure provides a larger contact area for the subsequently formed via structure than the conventional S/D contact structure with a flat top surface, thereby reducing the contact resistance between the S/D contact structure and the corresponding via structure. Moreover, the dielectric capping layer compensates the loss of the gate electrode layer and/or the gate spacer structures during the etching of the S/D contact opening. Therefore, the S/D contact structure can be safely isolated from the gate electrode layer, thereby reducing leakage between the gate electrode layer and the S/D contact structure or preventing the short between the gate electrode layer and the S/D contact structure.

In some embodiments, a semiconductor device structure is provided. The semiconductor device structure includes a gate electrode layer formed over a substrate and a gate spacer structure formed over a sidewall of the gate electrode layer. The semiconductor device structure also includes a source/drain contact structure adjacent to the gate spacer structure and separated from the gate electrode layer by the gate spacer structure. The source/drain contact structure includes a conductive base portion formed over a source/drain region in the substrate and a conductive capping portion with an arched top surface formed over the conductive base portion. The top surface of the conductive base portion is lower than the top surface of the gate electrode layer. The semiconductor device structure further includes a first dielectric capping layer formed over the source/drain contact structure.

In some embodiments, a semiconductor device structure is provided. The semiconductor device structure includes a source/drain region in a substrate and a first conductive layer formed over the source/drain region. The semiconductor device structure also includes a conductive capping layer with a convex top surface covering the top surface of the first conductive layer and a dielectric capping layer covering the convex top surface of the conductive capping layer. The semiconductor device structure further includes a dielectric spacer structure adjacent to the first conductive layer and a second conductive layer formed in the dielectric capping layer and in direct contact with the convex top surface of the conductive capping layer.

In some embodiments, a method for forming a semiconductor device structure is provided. The method includes forming a first dielectric layer over a substrate and forming a gate structure in the first dielectric layer. The gate structure includes a gate dielectric layer, a gate electrode layer formed over the gate dielectric layer, and a gate spacer structure covering a sidewall of the gate electrode layer. The method also includes etching the first dielectric layer to form an opening that exposes a source/drain region in the substrate and forming a first conductive layer in the opening. The top surface of the first conductive layer is lower than the top surface of the gate spacer structure. The method further includes forming a conductive capping layer with an arched top surface in the opening to cover the top surface of the first conductive layer and forming a first dielectric capping layer in the opening to cover the arched top surface of the conductive capping layer. In addition, the method includes forming a second conductive layer in the first dielectric capping layer. The second conductive layer is electrically connected to the source/drain region via the first conductive layer.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a first dielectric layer over a substrate;

forming a gate structure in the first dielectric layer, wherein the gate structure comprises:

a gate dielectric layer;

a gate electrode layer formed over the gate dielectric layer; and a gate spacer structure covering a sidewall of the gate electrode layer;

etching the first dielectric layer to form an opening that exposes a source/drain region in the substrate;

forming a first conductive layer in the opening, wherein a top surface of the first conductive layer is lower than a top surface of the gate spacer structure;

forming a conductive capping layer with an arched top surface in the opening to cover the top surface of the first conductive layer, wherein the arched top surface and a bottom surface of the conductive capping layer are between a top surface and a bottom surface of the gate electrode layer;

forming a first dielectric capping layer in the opening to cover the arched top surface of the conductive capping layer; and forming a second conductive layer in the first dielectric capping layer, wherein the second conductive layer is electrically connected to the source/drain region via the first conductive layer.

2. A method for forming a semiconductor device structure, comprising:

forming a first dielectric layer over a substrate;

forming a gate electrode layer in the first dielectric layer;

recessing the gate electrode layer to form a recessed top surface lower than a top surface of the first dielectric layer;

forming a first dielectric capping layer over the recessed top surface of the gate electrode layer, wherein a top width of the recessed top surface of the gate electrode layer is substantially equal to a top width of the first dielectric capping layer;

forming an opening in the first dielectric layer to expose a source/drain region in the substrate;

forming a first conductive layer in the opening;

forming a conductive capping layer with an arched top surface in the opening and over the first conductive layer; and forming a second dielectric capping layer in the opening to cover the arched top surface of the conductive capping layer.

3. The method as claimed in claim 2, further comprising:

recessing the gate electrode layer; and forming a second dielectric capping layer over the recessed gate electrode layer, wherein a bottom surface of the second dielectric capping layer is higher than the arched top surface of the conductive capping layer, and a top surface of the second dielectric capping layer is substantially level with a top surface of the first dielectric capping layer.

4. The method as claimed in claim 2, wherein a portion of the gate electrode layer is removed during the etching of the first dielectric layer, and wherein a space formed by the removal of the portion of the gate electrode layer is filled with the first dielectric capping layer.

5. The method as claimed in claim 2, wherein a portion of the spacer structure is removed during the etching of the first dielectric layer, and wherein a space formed by the removal of the portion of the spacer structure is filled with at least one of the first conductive layer, the first dielectric capping layer, and the second conductive layer.

6. The method as claimed in claim 2, further comprising:

successively forming a second dielectric layer and a third dielectric layer to cover the gate structure and the first dielectric capping layer before forming the second conductive layer and after forming the first dielectric capping layer.

7. The method as claimed in claim 2, wherein forming the opening comprises:

forming a masking layer to cover the dielectric capping layer and expose the first dielectric layer; and etching the exposed first dielectric layer using the masking layer as an etch mask.

8. The method as claimed in claim 7, wherein forming the first conductive layer comprises:

forming a conductive material layer over the masking layer and filling the opening; and removing the conductive material layer over the masking layer and a portion of the conductive material layer in the opening to form the first conductive layer, wherein the first conductive layer has a top surface lower than the recessed top surface of the gate electrode layer.

9. The method as claimed in claim 2, further comprising:

successively forming a second dielectric layer and a third dielectric layer over the first dielectric capping layer and the second dielectric capping layer;

successively etching the third dielectric layer, the second dielectric layer, and the second dielectric capping layer to expose the arched top surface of the conductive capping layer; and forming a second conductive layer in the second dielectric capping layer and electrically connected to the conductive capping layer.

10. The method as claimed in claim 9, wherein a top surface of the second conductive layer is higher than a top surface of the first dielectric capping layer.

11. The method as claimed in claim 2, wherein a top surface of the first dielectric capping layer is substantially level with a top surface of the second dielectric capping layer.

12. The method as claimed in claim 2, wherein a bottom surface of the conductive capping layer is lower than the recessed top surface of the gate electrode layer.

13. The method as claimed in claim 2, wherein an angle between the top surface of the first conductive layer and the arched top surface of the conductive capping layer is greater than 0 and less than 90°.

14. A method for forming a semiconductor device structure, comprising:

forming a first dielectric layer over a substrate;

forming a gate electrode layer in the first dielectric layer;

forming an opening adjacent to the gate electrode layer and in the first dielectric layer;

forming a first conductive layer in the opening;

forming a conductive capping layer with a convex top surface in the opening, wherein a top width of the first conductive layer is substantially equal to a bottom width of the conductive capping layer; and forming a dielectric capping layer in the opening to cover the convex top surface of the conductive capping layer.

15. The method as claimed in claim 14, wherein forming the opening comprises:

successively forming a second dielectric layer and a third dielectric layer over the first dielectric layer and he gate electrode layer; and successively etching the third dielectric layer, the second dielectric layer, and the first dielectric layer to form the opening.

16. The method as claimed in claim 15, further comprising:

forming a second conductive layer in the dielectric capping layer and surrounded by the second dielectric layer and the third dielectric layer, wherein the second conductive layer is electrically connected to the conductive capping layer.

17. The method as claimed in claim 14, wherein the opening exposes a portion of a sidewall of the gate electrode layer, and wherein the portion of the sidewall of the gate electrode layer is higher than the convex top surface.

18. The method as claimed in claim 17, wherein forming the first conductive layer comprises:

filling the opening with a conductive material layer, so that the portion of the sidewall of the gate electrode layer is covered by the conductive material layer; and recessing the conductive material layer until the portion of the sidewall of the gate electrode layer is exposed from the recessed conductive material layer, so as to form the first conductive layer.

19. The method as claimed in claim 14, wherein an angle between the top surface of the first conductive layer and the convex top surface of the conductive capping layer is greater than 0 and less than 90°.

20. The method as claimed in claim 14, further comprising:

forming a gate spacer structure covering a sidewall of the gate electrode layer, wherein the opening exposes a portion of a sidewall of the gate spacer structure, and wherein the portion of the sidewall of the gate spacer structure is higher than the convex top surface.

* * * * *